United States Patent

Wong

Patent Number: 5,754,065
Date of Patent: May 19, 1998

[54] DRIVING SCHEME FOR A BRIDGE TRANSISTOR

[75] Inventor: Stephen L. Wong, Scarsdale, N.Y.

[73] Assignee: Philips Electronics North America Corporation, New York, N.Y.

[21] Appl. No.: 553,228

[22] Filed: Nov. 7, 1995

[51] Int. Cl.$^6$ .................................................. H03B 1/00
[52] U.S. Cl. ...................................... 327/108; 327/73
[58] Field of Search ............................ 327/72, 383, 73, 327/387, 108, 423, 110, 436, 365, 427, 374, 376

[56] References Cited

U.S. PATENT DOCUMENTS

| | | | |
|---|---|---|---|
| 4,720,641 | 1/1988 | Faini | 307/18 |
| 5,138,200 | 8/1992 | Barsanti et al. | 307/482 |
| 5,187,414 | 2/1993 | Fellows et al. | 315/307 |
| 5,218,523 | 6/1993 | Sugishima | 363/132 |
| 5,404,051 | 4/1995 | Kobayashi | 327/108 |
| 5,491,436 | 2/1996 | Austin | 327/108 |
| 5,497,113 | 3/1996 | Uber | 327/108 |
| 5,543,740 | 8/1996 | Wong | 327/74 |

FOREIGN PATENT DOCUMENTS 0367006   5/1990   European Pat. Off.
2180422   3/1987   United Kingdom.

OTHER PUBLICATIONS

E. Hebenstreit, Driving the SIPMOS Field–Effect Transistor as a Fast Power Switch, Siemens Forsch.–U. Entwickl.–Ber. BD. 9 (1980) NR. 4.

Brian E. Taylor, An Integrated High–Voltage Bridge Driver Simplifies Drive Circuits in Totem–Pole Inverters, PCI, Jun. 1988 Proceedings.

*Primary Examiner*—Timothy P. Callahan
*Assistant Examiner*—Jeffrey Zweizig
*Attorney, Agent, or Firm*—Edward Blocker

[57] ABSTRACT

In a circuit arrangement including a pair of transistors serially connected together in a totem pole arrangement for bridging two buses at different voltage potentials, a driving scheme for controlling the conductive state of one of the pair of transistors. The scheme includes sensing the voltage difference across this one transistor by comparing a substantially fixed level represented by the voltage potential at one bus to a varying level. The varying level is based on the voltage at a junction joining the two transistors together. When the sensed voltage is at or below a predetermined level this one transistor is turned on.

21 Claims, 3 Drawing Sheets

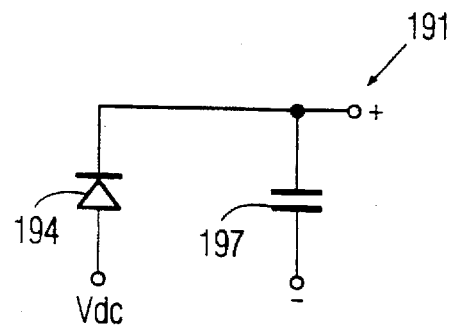
FIG. 5
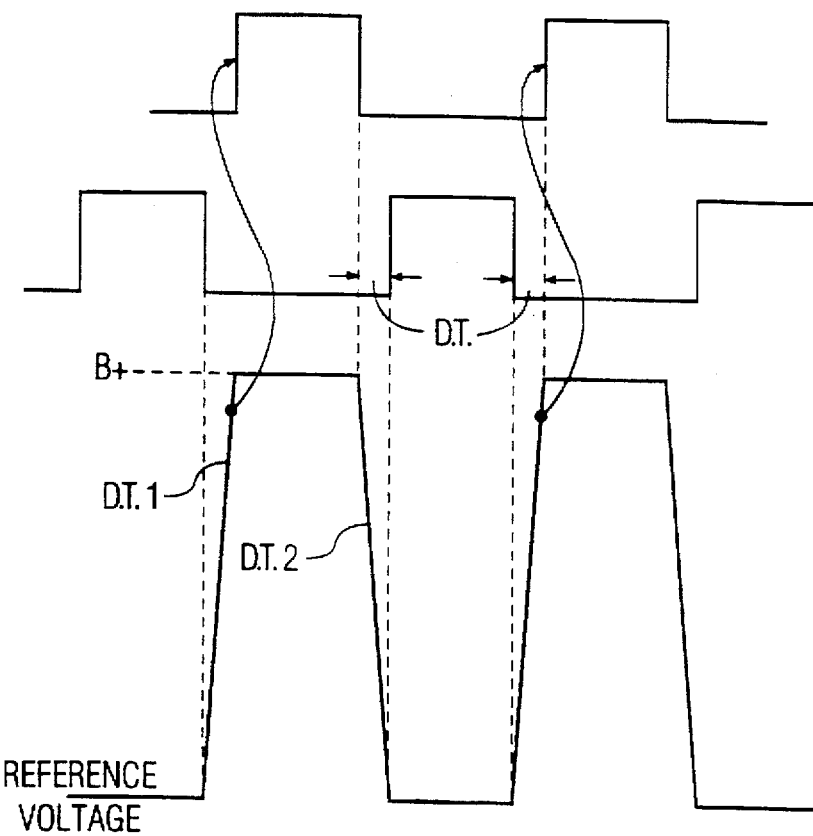
FIG. 6A
FIG. 6B
FIG. 6C

DRIVING SCHEME FOR A BRIDGE TRANSISTOR

BACKGROUND OF THE INVENTION

This invention relates generally to a bridge driver, and more particularly to a driving scheme for a bridge transistor.

Bridges, including half bridge and full bridge topologies, are typically used within circuitry for motor control and power supplies for ballasting of a lamp. In either topology, at least one pair of transistors are serially connected between the B+ and ground (reference) buses. The pair of transistors appear to be connected one on top of the other in a totem pole configuration. The transistor connected to the B+ bus is commonly referred to as the top transistor and the transistor connected to the ground bus is commonly referred to as the bottom transistor of the totem pole. The junction joining the transistors together is commonly referred to as a floating ground since it floats between the B+ and ground buses depending on the conductive state of each transistor.

The transistors are often power metal oxide semiconductor field effect transistors (MOSFETs). Each transistor is turned on only when a low or zero voltage condition exists across the transistor. When turning on the top transistor with the bottom transistor already turned off, a voltage is applied to a gate of the MOSFET relative to the floating ground. Under these conditions, the voltage of the floating ground is at about the B+ bus potential. The voltage applied to the gate therefore must be raised relative to the potential of the B+ bus in order to turn on the top transistor and is typically accomplished through use of a level shifter. The level shifter also minimizes the period of time during transition when both transistors are turned off (commonly referred to as deadtime) to prevent any possible conduction from the B+ bus to the ground bus.

A typical level shifter, such as part no. IR2110 from International Rectifier Corporation of El Segundo, Calif., controls the conductive state of the top transistor through the generation of timed current pulses supplied to circuitry for driving the top transistor (i.e. high side switch control circuitry). The generation of these timed current pulses is based on the conductive state of the bottom transistor. At frequencies above about 100 kilohertz (e.g. for bridges within induction lamp ballasts operating at frequencies up to several megahertz), losses associated with these current pulses are relatively high and result in large heat losses. High frequency operation for such bridges is therefore impractical.

There is also a growing trend toward minimizing the amount of space required for any and all circuitry required to drive the transistors. Reduction in the area taken up by conventional circuitry required for level shifting would be extremely advantageously.

It is therefore desirable to provide a driving scheme for a bridge topology which reduces the losses associated with controlling the conductive state of the top transistor within a totem pole configuration. It is also desirable to provide a driving scheme for a bridge topology in which circuitry for level shifting can be reduced in size.

SUMMARY OF THE INVENTION

In accordance with a first aspect of the invention, a circuit arrangement bridging together a first bus at a first voltage and a second bus at a second voltage includes a first switch connected to the first bus and a second switch connected to the second bus. The first switch and second switch are serially connected together between the first bus and the second bus. Control circuitry controls the conductive state of the first switch in response to the voltage difference across the first switch.

The circuit arrangement determines when the first switch will be turned on. There is no need for level shifting circuitry directed to turning on the first switch. As compared to conventional bridge topology, when a top transistor in a totem pole configuration serves as the first switch, losses associated with level shifting in turning on the top transistor can be reduced. By eliminating the need for level shifting circuitry in turning on the top transistor, the area taken up by the level shifting circuitry also can be reduced.

The control circuitry can include a voltage sensor for producing a feedback signal representing a comparative state between a varying voltage and a substantially fixed voltage. The control circuitry can further include logic circuitry responsive to the feedback signal for controlling turn on of the first transistor and latch circuitry for storing the comparative state represented by the feedback signal. Delay circuitry can also be included within the control circuitry for delaying storing of the comparative state represented by the feedback signal thereby delaying turn on of the first switch.

The varying voltage is based on a voltage at a junction joining the first transistor to the second transistor. In a first embodiment of the invention, the junction voltage serves as the varying voltage. In another embodiment of the invention, the control circuitry further includes a voltage source having a substantially constant voltage wherein the varying voltage is based on both the substantially constant voltage and the junction voltage. In a feature of this invention, the varying voltage can be equal to the sum of the substantially constant voltage and the junction voltage.

In accordance with a second aspect of the invention, a circuit arrangement bridges together a first bus at a first voltage and a second bus at a second voltage with a junction therebetween having a varying voltage from about the first voltage to about the second voltage. The circuit arrangement includes a first transistor connected to the first bus and a second transistor connected to the second bus. The first transistor and second transistor are serially connected together between the first bus and the second bus. Control circuitry controls the conductive state of the first transistor in response to the voltage difference between the first voltage and the varying voltage. The control circuitry includes a voltage sensor for producing a feedback signal reflecting a comparative state between the varying voltage and a substantially fixed level represented by the first voltage.

In accordance with a third aspect of the invention, in a circuit arrangement having a first transistor serially connected to a second transistor which together bridge a first bus at a first voltage to a second bus at a second voltage, a method for controlling the conductive state of the first transistor comprises the steps of sensing the voltage across the first transistor, producing a feedback signal representing the sensed voltage and turning on the first transistor in response to the feedback signal. It is a feature of this third aspect of the invention that the step of sensing further includes comparing a substantially fixed level represented by the first voltage to a varying level ranging from about the first voltage to about the second voltage. It is another feature of this third aspect of the invention that the step of turning on the first transistor is in response to the feedback signal representing the sensed voltage being at or below a predetermined level.

Accordingly, it is an object of the invention to provide an improved driving scheme for a bridge transistor within a totem pole configuration which is energy efficient.

It is another object of the invention to provide an improved driving scheme for a bridge transistor within a totem pole configuration in which losses associated with a level shifter in controlling the conductive state of the transistor are reduced.

It is still another object of the invention to provide an improved driving scheme for an inverter having a bridge topology in which circuitry for level shifting can be reduced in size.

Still other objects and advantages of the invention, will, in part, be obvious and will, in part, be apparent from the specification.

The invention accordingly comprises several steps in a relation of one or more of such steps with respect to each of the others, and the device embodying features of construction, a combination of elements and arrangement of parts which are adapted to effect such steps, all is exemplified in the following detailed disclosure and the scope of the invention will be indicated in the claims.

BRIEF DESCRIPTION OF THE DRAWINGS

For a fuller understanding of the invention, reference is had to the following description taken in connection with the accompanying drawings, in which:

FIG. 5 is a schematic of a suitable voltage supply in accordance with the alternative embodiment of FIG. 3; and FIGS. 6A, 6B and 6C are waveforms in timed relation to one another illustrating the gate inputs to the power transistors and the output from the bridge circuits of FIGS. 1 and 3.

DETAILED DESCRIPTION OF THE PREFERRED EMBODIMENTS

Figure 1:
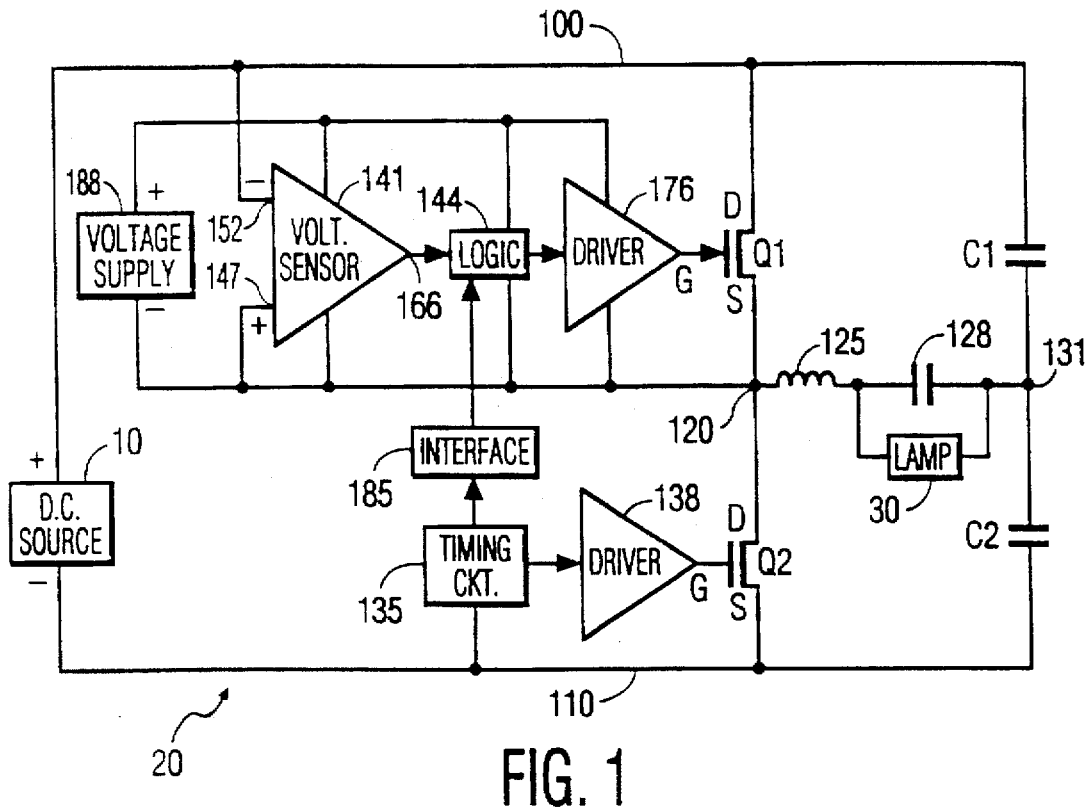
FIG. 1 is a block diagram of a bridge circuit in accordance with a first embodiment of the invention.

In the following description of the figures, elements identified by like reference numerals indicate components of similar construction and operation. Although the invention will be described in connection with a ballast for powering a lamp load, it is to understood that the invention is not limited to use with a ballast and can be readily used for other bridge circuit applications including motor control and for powering other types of loads. It should also be understood that although the bridge topology described herein is in the form of a half bridge, full bridge topologies are within the scope of the invention.

Referring now to FIG. 1, a D.C. power source 10 is connected to a bridge circuit 20 for powering a load such as a lamp load 30. Power source 10 typically includes an electromagnetic interference (EMI) filter (not shown) for removing EMI from entering an A.C. power line, a rectifier (not shown) for rectifying the A.C. signal and a preconditioner (not shown) for establishing a substantially constant D.C. voltage applied to bridge circuit 20. A suitable D.C. source can include, but is not limited to the EMI filter, rectifier and preconditioner disclosed in U.S. Pat. No. 5,187,414, incorporated herein by reference thereto.

Bridge circuit 20 includes two serially connected transistors Q1 and Q2 of the MOSFET power type bridging a rail (bus) 100 at a B+ potential (voltage) to a reference bus 110 typically at ground potential. Transistors Q1 and Q2, which serve as switches, each have a drain D, a source S and a gate G. Drain D of transistor Q1 is connected to rail 100. Source S of transistor Q2 is connected to bus 110. Source S of transistor Q1 and drain D of transistor Q2 are connected together at a junction 120. In accordance with the invention, transistors Q1 and Q2 also can be of the bipolar type or substituted for another type of switching device provided the switching devices can be controlled so as to provide an alternating current at a desired frequency flowing through lamp load 30.

An inductor 125 and a capacitor 128 are serially connected together between junction 120 and a junction 131. Lamp load 30 is connected across capacitor 128. A pair of capacitors C1 and C2 are serially connected between rail 100 and bus 110. Capacitors C1 and C2 are joined together at junction 131. Junctions 120 and 131 together serve as the output for bridge circuit 20. Inductor 125 and capacitor 128 form a resonant circuit. The switching frequency of transistors Q1 and Q2 can be varied or set to a fixed frequency based, in part, on the resonant frequency of the resonant circuit for starting and steady state operation of lamp load 30.

Transistors Q1 and Q2 are never on at the same time. The voltage at junction 120 floats between a voltage level equal to about a diode drop above the voltage of rail 100 and about a diode drop below the voltage of bus 110 and is based on both the conductive states of transistors Q1 and Q2 and the elapsed time since each transistor has been turned on.

A timing circuit 135 and a driver 138 in combination control when transistor Q2 is turned on and off timing circuit 135 generates timing signals supplied to driver 138. Driver 138, in response to the timing signals, produces a driving signal supplied to gate G of transistor Q2 for turning on and off the latter. The driving signal, shown in FIG. 6B, is discussed in greater detail below.

Transistor Q1 is turned on based on the sensed voltage difference between the substantially fixed voltage of rail 100 and the varying voltage of junction 120. This voltage difference is detected by a voltage sensor 141. Voltage sensor 141 (e.g. a comparator) includes a noninverting input 147 connected to source S of transistor Q1, an inverting input connected to drain D of transistor Q1 and an output 166. The voltage difference (i.e. voltage drop) across transistor Q1 (i.e. between drain D and source S of transistor Q1) is compared by voltage sensor 141 to a predetermined level. A feedback signal is produced at output 166 and supplied to a logic circuit 144 whenever the voltage difference is at or below the predetermined level.

The feedback signal produced at output 166 by voltage sensor 141 represents a comparative state between a varying voltage and a substantially fixed voltage. When the feedback signal is at a high logic level, the voltage difference across transistor Q1 is at or less than a predetermined level. When the feedback signal is at a low logic level, the voltage difference across transistor Q1 is above this predetermined level.

Figure 2:
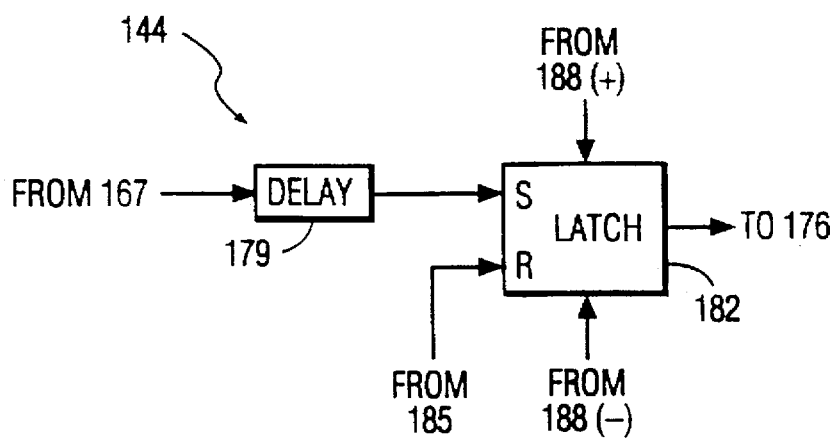
FIG. 2 is a block diagram illustrating in greater detail the logic circuit of FIG. 1.

Logic circuit 144, in response to the logic level produced at output 166 of voltage sensor 141, stores the comparative state represented by the feedback signal. As shown in FIG. 2, logic circuit 144 can include an optional delay circuit 179 for delaying the turning on of transistor Q1 to lengthen the associated deadtime identified in FIG. 6C as D.T. 1. Delay circuit 179 can be formed with resistor-capacitor (RC) circuitry or other well known delay devices. The comparative state can be stored by a latch 182, the output of delay circuit 179 being supplied to a set S input of latch 182. In response to the output signal from latch 182 when the set S input is at a high logic level, a driving signal produced by driver 176 is supplied to gate G of transistor Q1 for turning on the latter. The driving signal for gate G of transistor Q1, shown in FIG. 6A, is discussed in greater detail below. A voltage supply 188 serves as a D.C. source for powering voltage sensor 141, logic circuit 144 and driver 176.

Interface circuit 185, in response to a timing signal generated by timing circuit 135, generates a reset signal supplied to a reset R input of latch 182 for resetting the latter. Interface circuit 185, which is a low-to-high voltage interface, can include a level shifter such as produced by International Rectifier Corporation of El Segundo, Calif. as part no. IR 2110. The timing signals supplied to interface circuit 185 by timing circuit 135 are generated only for controlling turn off of transistor Q1 and are produced before transistor Q2 is allowed to turn on. The timing signals supplied to driver 138 by timing circuit 135 are generated for controlling turn on and turn off of transistor Q2. In lieu of interface circuit 185, an additional timing circuit (not shown) can be provided for generating the reset signal.

Preferably as much of the circuitry for controlling the conductive state of transistor Q1 is provided in a floating well. As used herein, a floating well designates a portion of an integrated circuit which is electrically floating with respect to other portions of the same integrated circuit whereby logic circuit 144, driver 176 and voltage supply 188 can float or vary with respect to D.C. source 10 in a manner well known to those of ordinary skill in this art.

Figure 3:
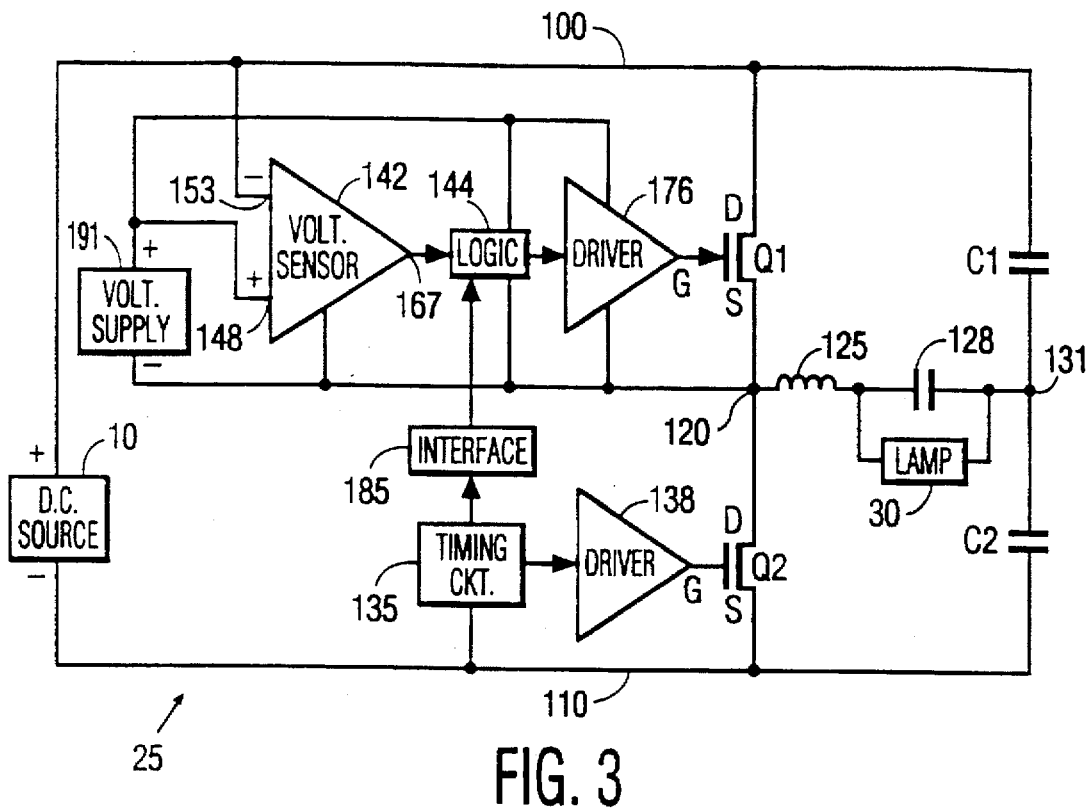
FIG. 3 is a block diagram of a bridge circuit in accordance with an alternative embodiment of the invention.
Figure 4:
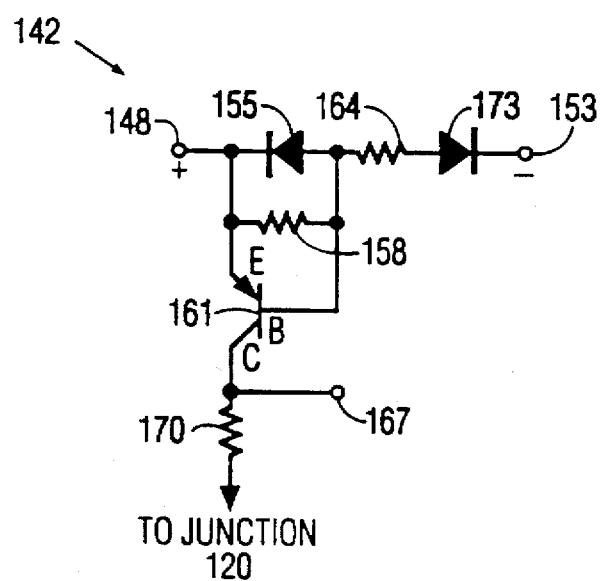
FIG. 4 is a schematic of a voltage sensor in accordance with the alternative embodiment of FIG. 3.

FIGS. 3, 4 and 5 illustrate an alternative embodiment of the invention in which D.C. power source 10 is connected to a bridge circuit 25 for powering lamp load 30. Bridge circuit is substantially the same as bridge circuit 20 in both construction and operation. Bridge circuit 25, however, includes a voltage sensor 142 and a voltage supply 191 rather than voltage sensor 141 and voltage supply 188 of bridge circuit 20.

As shown in FIG. 4, voltage sensor 142 includes a noninverting input 148 and an inverting input 153. A diode 155 includes a cathode connected to a junction joining together a resistor 158, an emitter E of a bipolar transistor 161 and noninverting input 148. The anode of diode 155 is connected to a junction joining together a resistor 164, resistor 158 and a base B of transistor 161. A collector C of transistor 161 is connected to a junction joining together an output 167 of voltage sensor 142, and one end of a resistor 170. The other end of resistor 170 is connected to a junction joining together a negative (−) terminal of a voltage supply 191, logic circuit 144, a driver 176 and junction 120. A high voltage diode 173 is connected between inverting input 153 and resistor 164 with the cathode and anode of diode 173 connected to inserting input 153 and resistor 164, respectively.

Voltage sensor 142 operates as follows: Whenever the voltage at noninverting input 148 is about 1.4 volts or more of the voltage at inverting input 153, base current will be pulled from transistor 161 turning on the latter. Collector current flowing through resistor 170 results in a high logic level being produced at output 167. Whenever the voltage at noninverting input 148 is less than about 1.4 volts of the voltage at inverting input 153 transistor 161 remains turned off. No collector current flows through resistor 170. Output 167 is now at a low logic level. When the voltage at inverting input 153 is as high as several hundred volts above the voltage at noninverting input 148 (i.e. when transistor Q1 is turned off and transistor Q2 is turned on), most of the high voltage is dropped across the reverse biased junction of high voltage diode 173 thereby protecting the integrity of voltage sensor 142.

Similar to voltage sensor 141, the feedback signal produced at output 167 by voltage sensor 142 represents a comparative state between a varying voltage and a substantially fixed voltage. When the feedback signal is at a high logic level, the voltage difference across transistor Q1 is at or less than a predetermined level (i.e. voltage at noninverting input 148 is about 1.4 volts or more of the voltage at inverting input 153). When the feedback signal is at a low logic level, the voltage difference across transistor Q1 is above this predetermined level (i.e. voltage at noninverting input 148 is less than about 1.4 volts of the voltage at inverting input 153).

Voltage sensor 141 of ballast 20 compares the voltage between drain D and source S of transistor Q1 to a fixed threshold of several volts. Voltage sensor 142 of ballast 25, however, compares the voltage between drain D of transistor Q1 to the voltage at the positive (+) terminal of voltage supply 191. The voltage across bootstrap capacitor 197 serves as a threshold reference for voltage sensor 142 which simplifies its design as compared to voltage sensor 141.

As shown in FIG. 5, voltage supply 191 includes a voltage source Vdc for providing a D.C. voltage between about 12 to 15 volts. A high voltage diode 194 is connected between voltage source Vdc and a junction joining together the positive (+) terminal of voltage supply 191 and a bootstrap capacitor 197. The noninverting input of voltage sensor, which is connected to the positive (+) terminal of voltage supply 191, varies between a voltage of Vdc (when transistor Q2 is turned on and transistor Q1 is turned off) and the sum of the B+ and Vdc voltages (when transistor Q2 is turned off and transistor Q1 is turned on). Bootstrap capacitor 197 essentially serves as a battery at a constant voltage powering other components within the floating well including logic circuit 144 and driver 176.

FIGS. 6A and 6B illustrate the driving signals supplied to gates G of transistors Q1 and Q2 by drivers 176 and 138, respectively. As shown in FIG. 6B, the period of time that both transistors Q1 and Q2 are turned off is identified as deadtime D.T. FIG. 6C illustrates the voltage waveform of ballast 20 or 25 between junction 120 and bus 110. During deadtime D.T., the voltage between junction 120 and bus 110 is either rising from a reference voltage at bus 110 to the B+ voltage at rail 100 (e.g. during period D.T. 1) or falling from the B+ voltage at rail 100 to a reference voltage at bus 110 (e.g. during period D.T. 2).

As can now be readily appreciated, the invention minimizes the deadtime during which transistors Q1 and Q2 are both turned off just prior to transistor Q1 being turned on (i.e. D.T. 1). More particularly, the invention in maintaining low switching losses for turning on transistor Q1 automatically determines when zero voltage switching conditions are present across transistor Q1. By establishing this deadtime automatically, there is no need to generate turn on timing information to high side switch control circuitry by a level shifter. Both area and power dissipation required for level shifting circuitry are advantageously reduced.

It will thus be seen that the objects set forth above and those made apparent from the preceding description are efficiently attained and since certain changes can be made in the above method and construction set forth without departing from the spirit and scope of the invention, it is intended that all matter contained in the above description and shown in the accompanying drawings shall be interpreted as illustrative and not in a limiting sense. For example, in lieu of timing circuit 135 and driver 138 circuitry similar to that associated with controlling the conductive state of transistor Q1 (i.e. voltage sensor, logic circuit, driver) can be used for controlling the conductive state of transistor Q2. Under such conditions, separate timing circuits could be employed to generate reset signals for each logic circuit 144.

It is also to be understood that the following claims are intended to cover all the generic and specific features of the invention herein described and all statements of the scope of the invention, which as a matter of language, might be said to fall therebetween.

What is claimed is:

1. A circuit arrangement bridging together a first bus at a first voltage and a second bus at a second voltage, comprising:

a first switch connected to the first bus;

a second switch connected to the second bus, the first switch and second switch being serially connected together between the first bus and the second bus, and control means for turning on the first switch in response to the voltage difference across the first switch being at or less than a predetermined level.

2. The circuit arrangement of claim 1, wherein the control means includes a voltage sensor for producing a feedback signal representing a comparative state between a varying voltage and a substantially fixed voltage.

3. The circuit arrangement of claim 2, wherein the control means further includes logic means responsive to the feedback signal for controlling turn on of the first switch.

4. The circuit arrangement of claim 3, wherein the logic means includes latch means for storing the comparative state represented by the feedback signal.

5. The circuit arrangement of claim 4, wherein the control means further includes delay means for delaying turn on of the first switch, the latch means being responsive to the delay means in delaying storage by the latch means of the comparative state represented by the feedback signal.

6. The circuit arrangement of claim 2, further including a junction having a junction voltage connecting the first switch to the second switch, the varying voltage being based on the junction voltage.

7. The circuit arrangement of claim 6, wherein the junction voltage serves as the varying voltage.

8. The circuit arrangement of claim 6, wherein the control means further includes a voltage source having a substantially constant voltage, the varying voltage being based on both the substantially constant voltage and the junction voltage.

9. The circuit arrangement of claim 8, wherein the varying voltage is equal to the sum of the substantially constant voltage and the junction voltage.

10. The circuit arrangement of claim 8, wherein the control means further includes a capacitor connected between the junction and voltage sensor.

11. The circuit arrangement of claim 6, wherein the control means further includes logic means responsive to the feedback signal for controlling when the first switch is turned on.

12. The circuit arrangement of claim 8, wherein the control means further includes logic means responsive to the feedback signal for controlling when the first switch is turned on.

13. The circuit arrangement of claim 1, wherein each switch includes a transistor.

14. The circuit arrangement of claim 2, wherein each switch includes a transistor.

15. The circuit arrangement of claim 6, wherein each switch includes a transistor.

16. A circuit arrangement bridging together a first bus at a first voltage and a second bus at a second voltage with a junction therebetween having a varying voltage from about the first voltage to about the second voltage, comprising:

a first transistor connected to the first bus;

a second transistor connected to the second bus, the first transistor and second transistor being serially connected together between the first bus and the second bus, and control means for turning on the first transistor in response to the voltage difference between the first voltage and the varying voltage being at or less than a predetermined level.

17. The circuit arrangement of claim 16, wherein the control means includes a voltage sensor for producing a feedback signal reflecting a comparative state between the varying voltage and a substantially fixed level represented by the first voltage.

18. The circuit arrangement of claim 16, wherein the junction connects the first transistor to the second transistor.

19. The circuit arrangement of claim 17, wherein the junction connects the first transistor to the second transistor.

20. In a circuit arrangement having a first transistor serially connected to a second transistor which together bridge a first bus at a first voltage to a second bus at a second voltage, a method for controlling the conductive state of the first transistor, comprising the steps of:

sensing the voltage across the first transistor;

producing a feedback signal representing the sensed voltage, and turning on the first transistor in response to the feedback signal representing the sensed voltage being at or below a predetermined level.

21. The method of claim 20, wherein the step of sensing further includes comparing a substantially fixed level represented by the first voltage to a varying level ranging from about the first voltage to about the second voltage.

* * * * *